US006628157B1

(12) United States Patent
Kuppuswamy et al.

(10) Patent No.: US 6,628,157 B1
(45) Date of Patent: Sep. 30, 2003

(54) VARIABLE DELAY ELEMENT FOR USE IN DELAY TUNING OF INTEGRATED CIRCUITS

(75) Inventors: Ravishankar Kuppuswamy, Hillsboro, OR (US); Gregory Taylor, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 863 days.

(21) Appl. No.: 08/989,917

(22) Filed: Dec. 12, 1997

(51) Int. Cl.[7] .............................................. H03H 11/26
(52) U.S. Cl. ........................ 327/276; 327/277; 327/284; 327/285
(58) Field of Search .................................. 327/276, 161, 327/277, 234, 235, 261, 262, 269, 270, 271, 278, 284, 285

(56) References Cited

U.S. PATENT DOCUMENTS

| | | | | |
|---|---|---|---|---|
| 4,016,511 A | * | 4/1977 | Ramsey et al. ............. 327/277 |
| 4,626,716 A | * | 12/1986 | Miki ........................... 327/270 |
| 5,204,559 A | * | 4/1993 | Dehimy ........................ 327/232 |
| 5,245,231 A | * | 9/1993 | Kocis et al. .................. 327/277 |
| 5,389,828 A | * | 2/1995 | Tago ........................... 327/263 |
| 5,389,843 A | * | 2/1995 | McKinney ................... 327/276 |
| 5,465,076 A | * | 11/1995 | Yamauchi .................... 327/276 |
| 5,495,197 A | * | 2/1996 | Hayashi ....................... 327/276 |
| 5,708,382 A | * | 1/1998 | Park ............................ 327/277 |

* cited by examiner

Primary Examiner—Timothy P. Callahan
Assistant Examiner—An T. Luu
(74) Attorney, Agent, or Firm—Kenyon & Kenyon

(57) ABSTRACT

A method and apparatus for delay tuning an integrated circuit which includes a delay element that includes a plurality of delay stages interconnected in a cascaded relationship, each stage imposing an incremental delay upon the input signal when enabled, the delay element receives a selection signal that determines how many of the delay stages are enabled. By varying the select signal, the delay element imposes a variable delay upon the input signal for testing and evaluation.

9 Claims, 5 Drawing Sheets

VARIABLE DELAY ELEMENT FOR USE IN DELAY TUNING OF INTEGRATED CIRCUITS

BACKGROUND OF THE INVENTION

1. Field of the Invention

The present invention relates to a method and apparatus that facilitates delay tuning of integrated circuits and, in particular, to a method and apparatus for providing a software implementation of delay tuning in integrated circuits.

2. Description of the Prior Art

Timing analysis is a critical element of the design of an integrated circuit. Vendors of integrated circuits often standardize the performance of their circuits to ensure that they meet a standardized timing scheme. The scheme may be the subject of a market-wide standard or may be established by the vendor itself. Often, the vendors distribute timing diagrams with their products to permit purchasers to integrate the products into larger designs. Thus, uniform, consistent timing performance is critical to market success of integrated circuits.

Consider the circuit of FIG. 1, for example. There, a microprocessor ($\mu$P) generates an address signal on, for example, sixteen (16) parallel address lines, labeled A0–A15. Due to characteristics of the circuitry that generates the address signals, the signals may be skewed: They may not be established in unison. Certain lines may become active before certain others. This performance may cause the microprocessor to deviate from the requirements of an established timing protocol.

Each address signal A0–A15 may be generated by the circuit of FIG. 2. There, a master slave flip flop 210 receives a data signal (the address data) generated from within the microprocessor. The flip flop 210 captures the data signal when triggered by a clock signal 220 and outputs the data signal thereafter. Typical trigger signals are the rising edge or the falling edge of the clock. Because the data signal may not be established at the flip flop input when the triggering signal is received from the clock, a delay circuit 240 may be added to delay propagation of the clock to the flip flop.

Excessive delays contribute to loss of data. New data may overcome old data before the old data is clocked into the flip flop 210. Accordingly, a latch 200 is provided between the source of the data signal and the flip flop. The latch 200 itself is clocked by a non-delayed clock signal 200. Under this scheme, old data may be clocked into the flip flop 210 before new data is input to the latch 200.

During circuit design, an amount of desired delay is unknown. Therefore, delay circuits are tuned. FIG. 3 illustrates the configuration of a known delay circuit 240 for a single data line. There, the circuit provides a plurality of alternate paths 242–246 for a data signal. Each path provides a different number of delay buffers in the path. Each delay buffer imposes an incremental amount of delay upon the signal. Thus, the selection of a path determines how much delay is imposed on the signal.

Through trial and error, technicians alternately direct the signal through each of the delay paths 242–246 to determine how much delay is necessary to meet desired timing requirements. The trial and error procedure is implemented in a physical prototype of the integrated circuit. To direct the signal through a particular delay path, a technician must establish a physical electrical connection to test a first path, test it, then destroy the connection and establish a second connection to test a second path. Once a preferred delay path is identified for the particular signal, the selected delay path becomes part of the design of the integrated circuit.

A single integrated circuit may have several hundred delay circuits. Every delay circuit within the integrated circuit must be "tuned" through the trial and error process described above. Delay tuning, therefore, materially increases the time and expense of integrated circuit manufacture.

Accordingly, there is a need in the art for a delay tuning process that reduces time and expense associated with delay tuning. Further, there is a need for such a process that eliminates the need for providing physical interconnections between a signal and the alternate delay paths that the signal must traverse for testing.

SUMMARY OF THE INVENTION

An embodiment of the present invention provides a delay element that receives an input signal and imposes a variable delay upon the signal. The delay element includes a plurality of delay stages interconnected in a cascaded relationship. Each stage imposes an incremental delay upon the input signal when enabled. The delay element receives a selection signal that determines how many of the delay stages are enabled.

DETAILED DESCRIPTION

Figure 1:
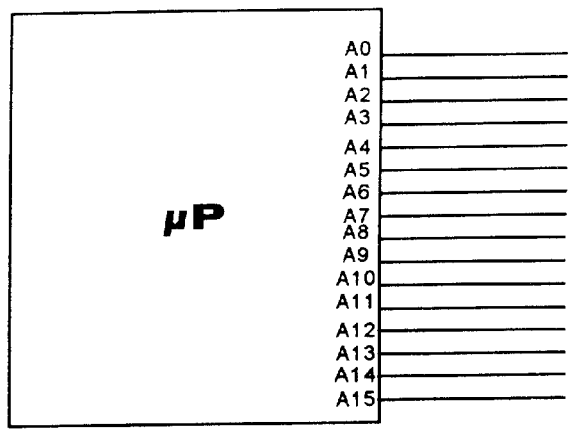
FIG. 1 illustrates a prior art microprocessor having a plurality of address line outputs.
Figure 2:
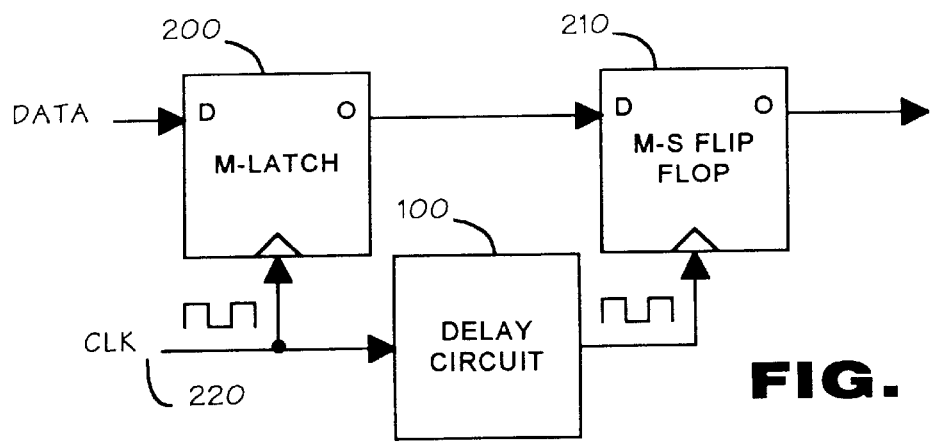
FIG. 2 illustrates a known latch-flip flop circuit.
Figure 3:
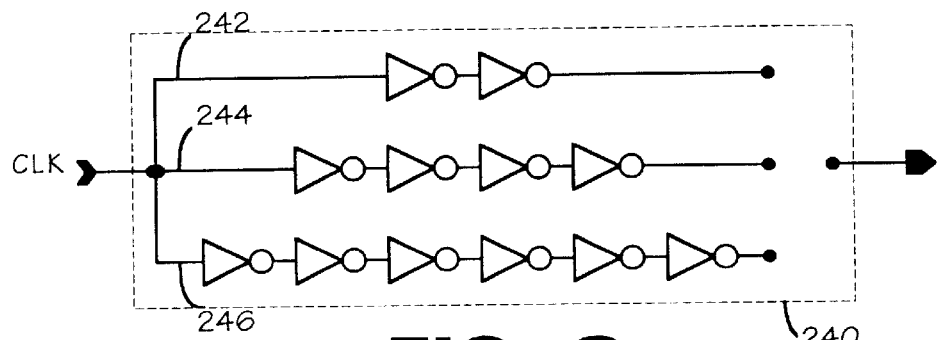
FIG. 3 illustrates delay paths used in the prior art.
Figure 4:
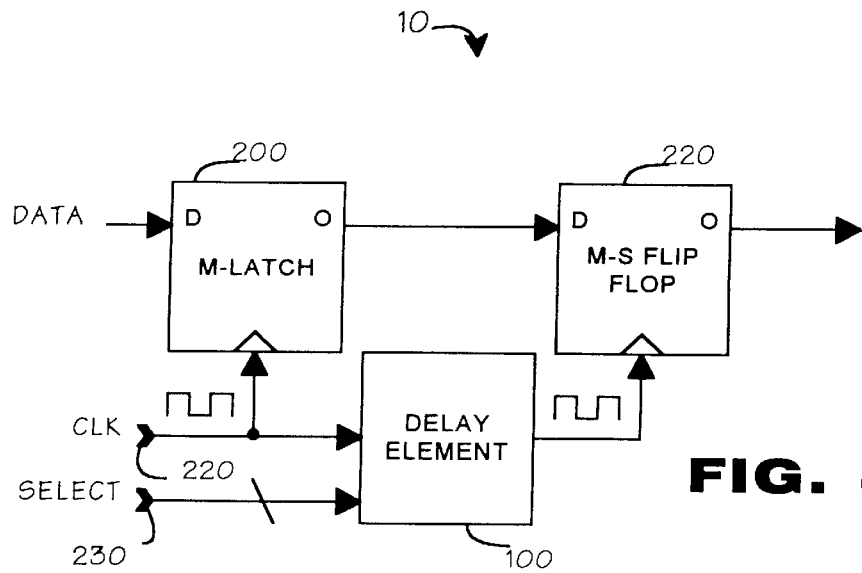
FIG. 4 is a block diagram of a latch-flip flop circuit according to an embodiment of the present invention.

Turning to FIG. 4, there is shown a data circuit 10 according to an embodiment of the present invention. The data circuit 10 may be used in an integrated circuit, such as the microprocessor of FIG. 1, in place of the circuit of FIG. 2. The data circuit 10 provides a conventional latch 200 and master slave flip flop 210. A data signal generated from a source internal to the integrated circuit 10 (not shown) is input to the latch 200. A clock signal 220 is input directly to the latch 200. From the latch, the data is input to the master slave flip flop 210. The clock 220 propagates through a variable delay element 100 to the flip flop 210. The delay element 100 provides variable delay to the propagation of the clock signal 220 to the flip flop 210. The variable delay is adjusted according to the value of a multibit SELECT signal 230 input to the delay element 100.

Figure 5:
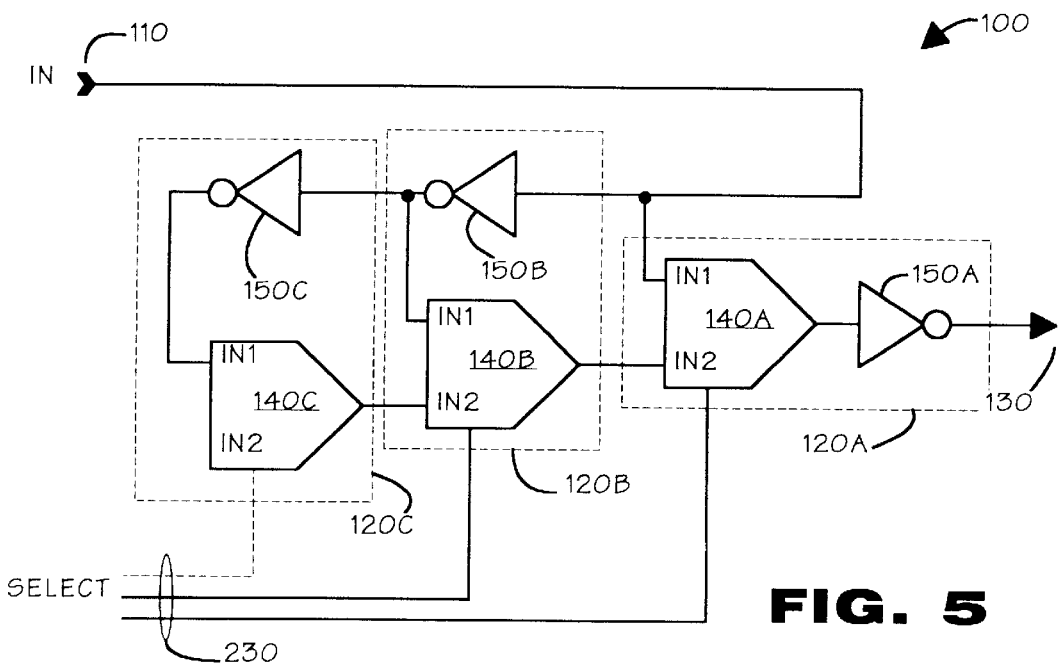
FIG. 5 is a block diagram of a delay circuit according to an embodiment of the present invention.

FIG. 5 is a block diagram of an embodiment of the delay element 100. The delay element 100 accepts an input signal at input 110. The delay element 100 is populated by a plurality of "stages" 120A–C, each imposing a predetermined same or different amount of delay upon the input signal. Each stage is populated by an inverter buffer and a delay block. The inverter buffer and delay blocks impose incremental delay upon the input signal. The delayed input signal is output from the delay element 100 at output 130.

In one embodiment, the orientation of the inverter buffer and delay blocks of each stage may vary by stage. In a first stage 120A, a first input of delay block 140A is coupled to the input terminal 110. The signal from input terminal 110 also passes through the first stage 120A to a next stage such as 120B. A second input of the delay block 140A is coupled to an output of another stage 120B. An output of delay block 140A is input to inverter buffer 150A. An output of buffer 150A is output from the delay element 100 at terminal 130.

Intermediate stages, such as stage 120B, receive an input from a previous stage 120A which is input to the inverter buffer 150B. An output of buffer 150B is input to a first input of the stage's delay block 140B and also output from the stage 120B to the next successive stage 120C. A second input to the delay block 140B is returned from the next stage 120C. An output of the delay block 140B is output from the stage 120B to the previous stage 120A.

A last stage 120C is configured somewhat similarly to the intermediate stage 120B. The input signal is input to an inverter buffer 150C. The delay block 140C of the last stage 120C has no second input. An output from the inverter buffer 150C is input to a delay block 140C. An output of the delay block 140C is returned to the previous stage 120B.

The SELECT signal 230 is a multibit signal. In the embodiment of FIG. 5, it provides a bit for every stage in the delay element 100. The SELECT signal 230 is a three bit code in the illustrated embodiment. Each bit determines how the associated delay block 140A, 140B, 140C is configured. When the SELECT bit is a "1," the delay block 140A, 140B, 140C switches to the signal input at terminal IN1. When the SELECT signal 230 is a "0," the delay block 140A, 140B, 140C switches to the signal input at terminal IN2. Of course, because delay block 140C receives only one input, the delay block 140C may be permanently switched to the first input; the select bit may be omitted in this case.

FIG. 5 illustrates a three stage embodiment, populated by only three delay blocks. However, the delay element 100 may provide as many delay stages as may be desired. For example, at the time of this writing, Intel Corporation, the assignee of the present invention, is considering an eight (8) stage delay element 100 for use in an integrated circuit.

Figure 6:
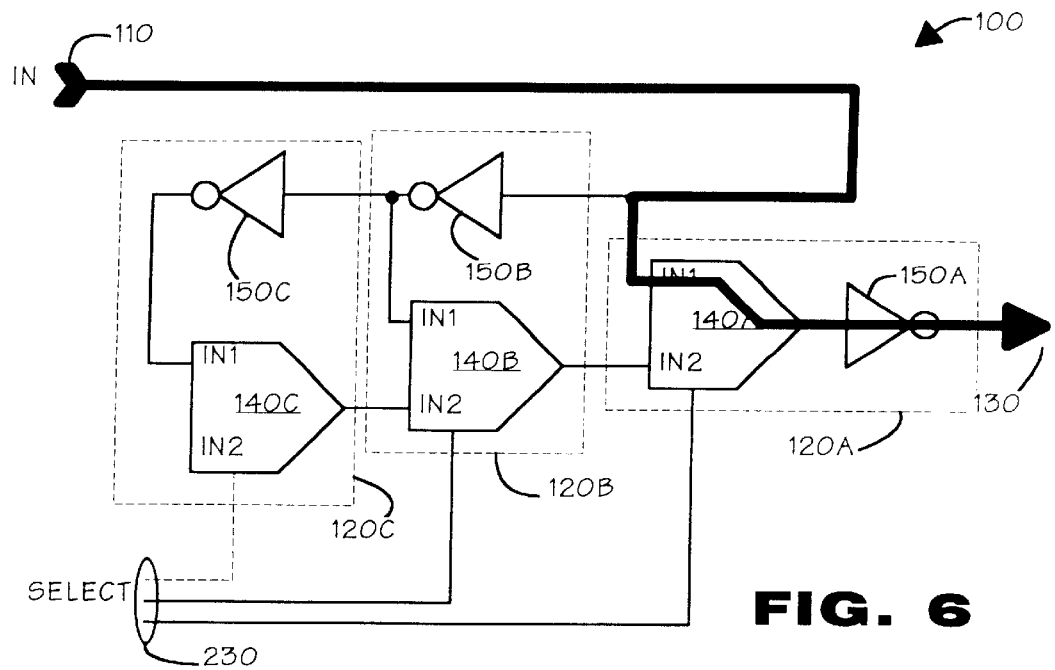
FIG. 6 is a block diagram illustrating operation of the delay circuit of FIG. 5 in response to a first predetermined SELECT input.
Figure 7:
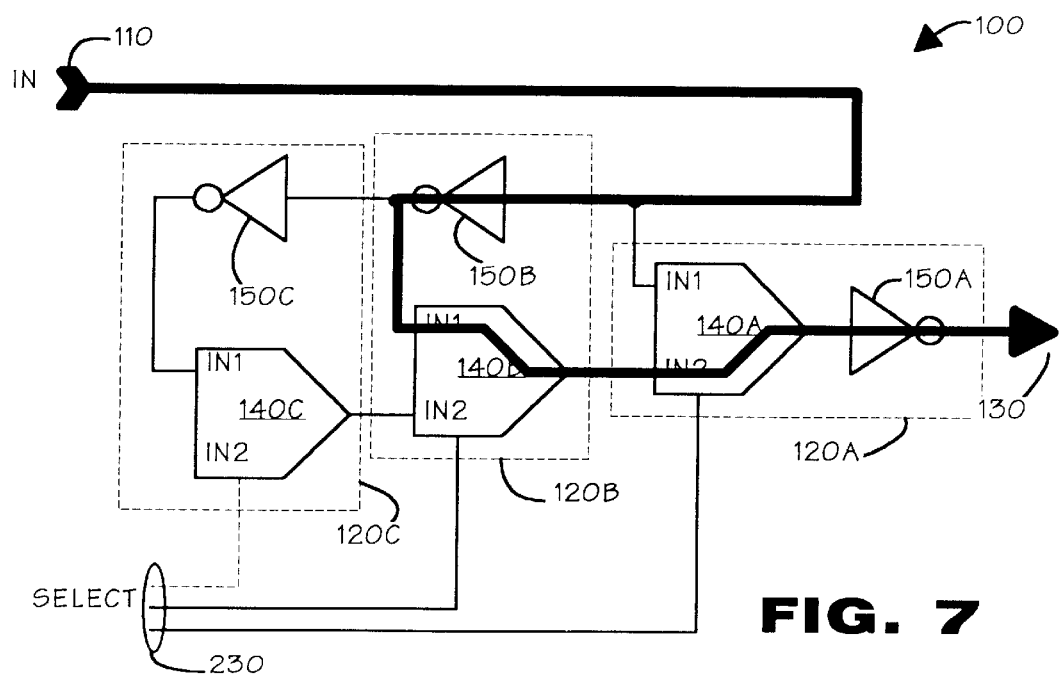
FIG. 7 is a block diagram illustrating operation of the delay circuit of FIG. 5 in response to a second predetermined SELECT input.
Figure 8:
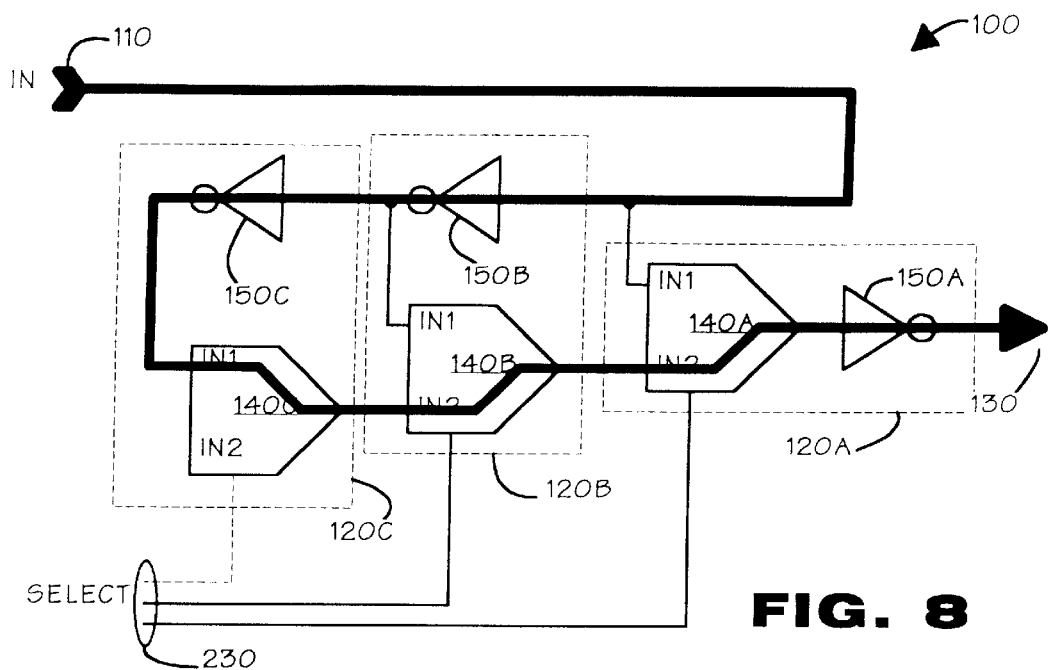
FIG. 8 is a block diagram illustrating operation of the delay circuit of FIG. 5 in response to a third predetermined SELECT input.

FIGS. 6–8 illustrate paths taken by the input signal depending upon the value of the SELECT signal:

As is shown in FIG. 6, when the SELECT signal 230 provides a "1" to delay block 140A, the delay block 140A routes the input signal from input terminal IN1 directly to the output inverter buffer 150A. The delay block 140A ignores any input to terminal IN2. Thus, the values of the SELECT signal 230 as input to delay blocks 140B and 140C are immaterial to the performance of the delay element 100. Delay block 140A and output inverter buffer 150A impose a minimum delay on the input signal.

When the SELECT signal 230 provides a "1" to delay block 140B and a "0" to delay block 140A, the input signal traverses the path highlighted in FIG. 7. There, the input signal is delayed by inverter buffer 150B, delay blocks 140B and 140A, and output inverter buffer 150A.

When the SELECT signal 230 provides a "1" to delay block 140C and a "0" to delay blocks 140A and 140B, the input signal traverses the path highlighted in FIG. 8. There, the input signal is delayed by inverter buffers 150B and 150C, by delay blocks 140C–A, and by inverter buffer 150A.

As noted above, each stage incrementally increases the delay imposed upon the input signal. Additional stages permit the delay element 100 to impose additional delay upon the input signal.

Figure 9:
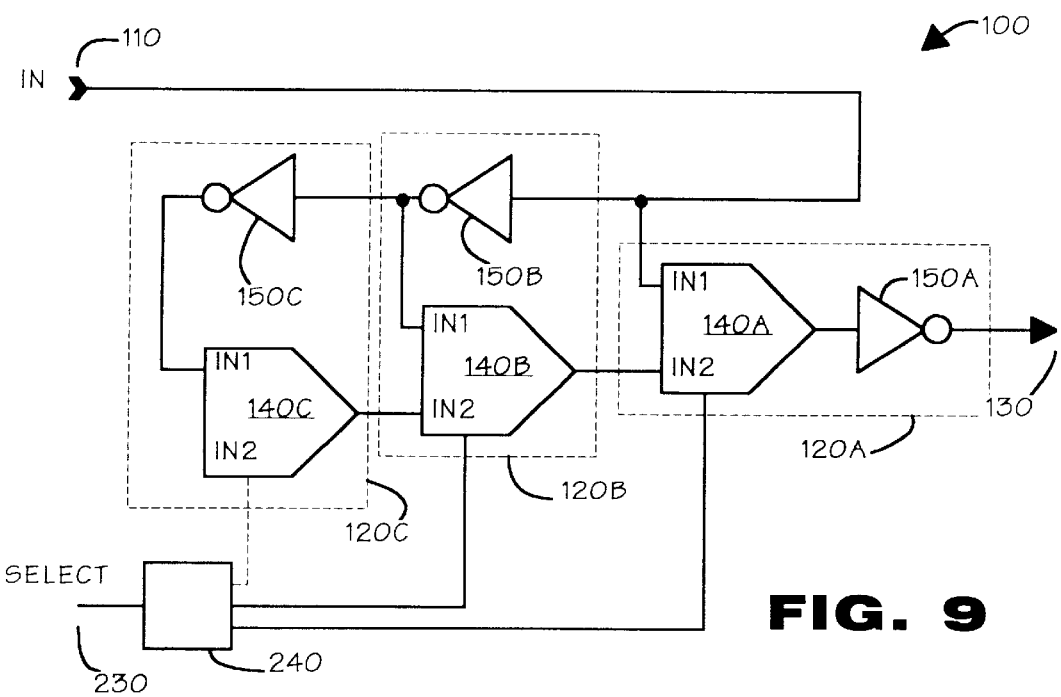
FIG. 9 is a block diagram of a delay circuit according to a second embodiment of the present invention.

In another embodiment, as is shown in FIG. 9, the SELECT signal 230 need not provide a separate bit for each delay block. Instead, a decoder 240 receives the SELECT signal 230 and, responsive to the value of the SELECT signal, controls operation of the delay blocks of each stage. The SELECT signal 230 remains a multibit signal that possesses a unique value associated with each path available in the delay element 100. For example, for an eight stage delay element, the SELECT signal 230 may be a three bit signal.

Figure 10:
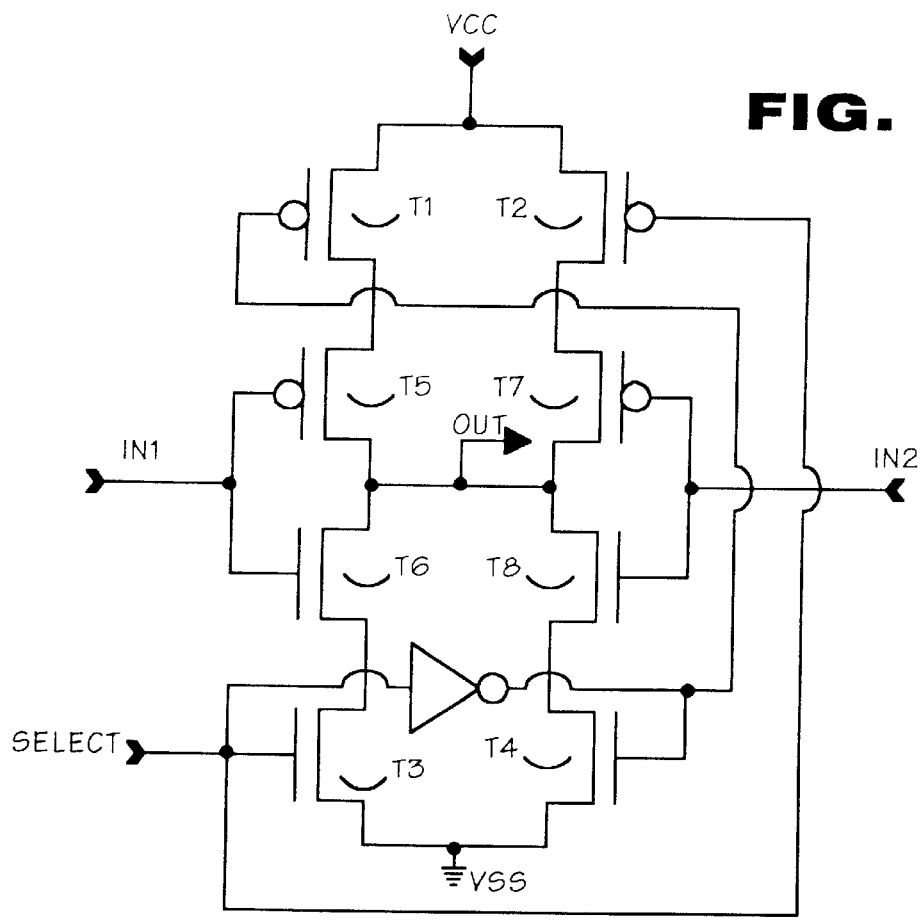
FIG. 10 is a circuit diagram of a delay element 100 according to an embodiment of the present invention.

FIG. 10 is a circuit diagram of an embodiment of a single delay block 140 of FIG. 5. The delay block is a tri-state multiplexer that chooses one of two inputs based on a locally decoded SELECT bit. The delay block 140 is populated by eight transistors. It provides two selection PMOS transistors, T1 and T2, each coupled to a high voltage source such as +5 volts (often termed "VCC"). Additionally, the delay block 140 provides two selection NMOS transistors, T3 and T4, coupled to a low voltage source, such as ground. As is known in the context of binary circuits, PMOS transistors become conductive in response to a low voltage input; NMOS transistors become conductive in response to a high voltage input.

Input IN1 is input to a pair of transistors T5 and T6. Transistor T5 is a PMOS transistor that, in combination with transistor T1, couples VCC to the output terminal OUT. The leg formed by transistors T1 and T5 outputs a high voltage signal ("1") when IN1 is low ("0") and the SELECT bit is high ("1") The second transistor T6, in combination with transistor T3, couples the low voltage source to the output terminal OUT. The leg formed by transistors T3 and T6 drive the output terminal low ("0") when IN1 is high ("1") and the SELECT bit is high ("1").

Similarly, input IN2 is input to a pair of transistors T7 and T8. Transistor T7 is a PMOS transistor that, in combination with transistor T2, couples VCC to the output terminal OUT. The leg formed by transistors T2 and T7 outputs a high voltage signal ("1") when IN2 is low ("0") and the SELECT bit is low ("0"). The second transistor T8, in combination with transistor T4, couples the low voltage source to the output terminal OUT. The leg formed by transistors T4 and T8 drive the output terminal low ("0") when IN2 is high ("1") and the SELECT bit is low ("0").

The block 140 defines its operation based upon the value of the SELECT input signal. When SELECT="0," the delay block 140 outputs a signal that represents an inversion of the IN2 input ($\overline{IN2}$). When SELECT="1," the delay block 140 outputs IN1 inverted ($\overline{IN1}$). Switching of the transistors of the delay block is demonstrated in the following table:

| SELECT | T1  | T2  | T3  | T4  | OUT              |
|--------|-----|-----|-----|-----|------------------|
| 0      | Off | On  | Off | On  | $\overline{IN2}$ |
| 1      | On  | Off | On  | Off | $\overline{IN1}$ |

Although PMOS and NMOS transistors are shown in FIG. 10, the present invention finds application with transistors of other types.

The delay element of the present invention eliminates any need for manual delay tuning of integrated circuits. The delay element 100 substitutes for known delay circuits within the integrated circuit. To tune the delay element, different SELECT signals may be applied to the delay element 100 over an appropriate electrical interface. To change delay in the delay element 100, only the value of the SELECT signal need be changed. Physical interconnections need not be changed.

Figure 11:
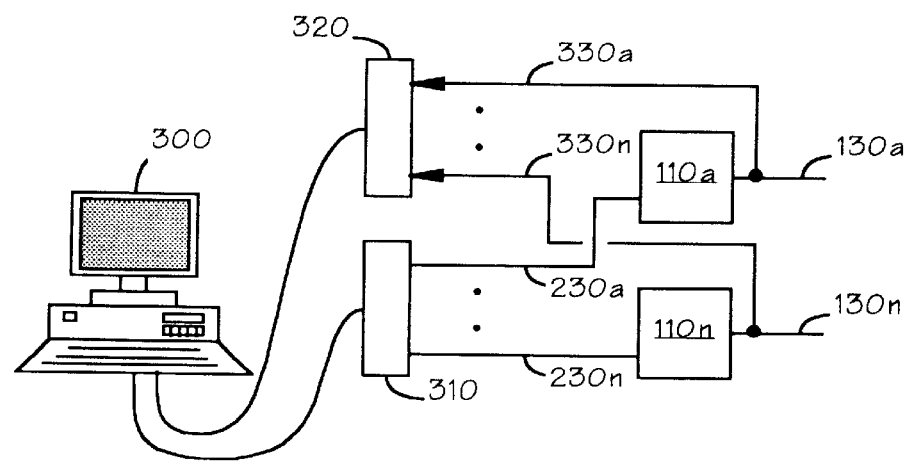
FIG. 11 is a schematic diagram of a system for delay tuning an integrated circuit constructed in accordance with the present invention.

In an embodiment of the present invention, an integrated circuit that includes delay elements may be tuned by a computer. Such a system is shown in FIG. 11. Consider an integrated circuit populated by n delay elements 100a–n, driving output lines 130a–n. There, a computer 300 is connected to each of the delay elements 100a–n by an electrical interface 310. The interface 310 drives SELECT lines 230a–n for each of the delay elements 100a–n. The computer 300 senses the output of the delay elements 100a–n over sensory lines 330a–n coupled to the computer via a second interface 320.

To delay tune a delay element 100a, the computer 300 may vary the SELECT signal 230a and measure delay associated with each SELECT setting via sensory line 330a. Once each setting is tested, a preferred setting that causes the delay to fall within a predetermined window may be detected.

After testing, when the desired SELECT code is identified, the SELECT signal is hardwired into the integrated circuit. That is, within the code, the SELECT bits that are a "1" are electrically connected to VCC; the SELECT bits that are a "0" are tied to ground. The integrated circuit may be mass produced with this hardwired implementation of the SELECT code.

Delay tuning also may be performed dynamically within in a circuit. Rather than hardwiring the SELECT signal to predetermined voltage sources, the SELECT signal may be coupled to a controller or state machine that senses when delay falls outside a preferred operating condition. To compensate, when it is detected that the delay is less than desired, the controller may vary the SELECT signal to increase the delay. When the delay is more than desired, the controller may vary the SELECT signal to reduce the delay.

The present invention provides a mechanism for use in skew compensation. When two data signals are to be generated synchronously, one of the signal may exhibit a natural delay that does not occur in another. In such a case, the signal with less natural delay may be configured to propagate through the delay element 100. By varying the SELECT signal, the two data signals may be brought into the desired synchronism.

The present invention has been described in the context of "data" signals and "clock" signals. It should be understood that such labels are provided to facilitate the presentation of the present invention. The principles of the present invention find application where it is desired to delay the propagation of any signal, regardless of the substantive information that the signal represents.

Several embodiments of the present invention are specifically illustrated and described herein. However, it will be appreciated that modifications and variations of the present invention are covered by the above teachings and within the preview of the appended claims without departing from the spirit and intended scope of the invention.

We claim:

1. A delay element, comprising:

an input that receives an input signal, an output, a plurality of delay stages mutually interconnected in a cascaded relationship, each stage to impose an incremental delay upon the input signal when included in a path of propagation of the input signal between the input and the output, and a selection input for a selection signal, the selection signal to determine how many of the delay stages are included in the path of propagation, at least one delay stage comprising an inverter buffer, and a delay block coupled to the inverter buffer, wherein the inverter buffer and the delay block combine to impose the incremental delay upon the input signal, and wherein an input of the inverter buffer is coupled to an input to the delay stage, and an output of the inverter buffer is coupled to an input of the delay block.

2. The delay element of claim 1, wherein a second input of the delay block is coupled to an output of a delay block of another delay stage, wherein the delay block selects among the first and the second inputs in response to the selection signal.

3. The delay element of claim 1, wherein the output of the inverter buffer is an input to another delay stage.

4. The delay element of claim 1, wherein the delay block provides an input to the delay stage, and an output of the delay block is coupled to an input of the inverter buffer.

5. The delay element of claim 1, wherein the selection signal is a multibit signal.

6. The delay element of claim 5, wherein the selection signal provides one bit associated with each delay stage of the delay element.

7. The delay element of claim 5, further comprising a decoder, having an input coupled to the selection signal and outputs coupled to each delay stage.

8. The delay element of claim 1, wherein the delay block is a tri-state multiplexer.

9. A delay tuning circuit, comprising a plurality of mutually interconnected delay stages, wherein:

a first delay stage includes a first input for a data signal to be delay tuned, a first output for a delayed data signal and a second input, intermediate delay stages each include a pair of inputs and a pair of outputs, the first input coupled to a second output of an adjacent delay stage, the first output coupled to a second input of the adjacent delay stage, the intermediate stages having a selectively switched internal propagation path from the first input to the first output.

* * * * *